United States Patent

Wolf et al.

[11] Patent Number: 6,016,568
[45] Date of Patent: Jan. 18, 2000

[54] HIGH RATE TRELLIS CODING AND DECODING METHOD AND APPARATUS

[75] Inventors: Jack Keil Wolf, Rancho Mirage; Ephraim Zehavi, San Diego, both of Calif.

[73] Assignee: QUALCOMM Incorporated, San Diego, Calif.

[21] Appl. No.: 09/110,700

[22] Filed: Jul. 7, 1998

Related U.S. Application Data

[63] Continuation of application No. 08/779,638, Jan. 7, 1997, Pat. No. 5,844,922, which is a continuation of application No. 08/023,789, Feb. 22, 1993, abandoned.

[51] Int. Cl.[7] ............................ G06F 11/10; H03M 13/12
[52] U.S. Cl. ........................ 714/792; 714/786; 714/790; 375/265
[58] Field of Search ...................... 714/792–795; 375/262, 265, 280, 304, 308, 329, 332, 341

[56] References Cited

U.S. PATENT DOCUMENTS

| | | | |
|---|---|---|---|
| 4,922,507 | 5/1990 | Simon et al. | 375/254 |
| 4,980,897 | 12/1990 | Decker et al. | 375/265 |
| 5,128,967 | 7/1992 | Durkin et al. | 375/329 |
| 5,233,630 | 8/1993 | Wolf | 375/308 |
| 5,428,631 | 6/1995 | Zehavi | 714/792 |
| 5,469,452 | 11/1995 | Zehavi | 714/792 |
| 5,748,834 | 5/1998 | Miyazaki et al. | 386/96 |

OTHER PUBLICATIONS

Viterbi et al. "Trellis–Coded MPSK Modulation for Highly Efficient Military Satellite Applications", IEEE, pp. 647–651, 1988.

Dehesh et al. Practical Application of TCM, IEEE, pp. 380–383, 1990.

Viterbi et al. "A Pragmatic Approach to Trellis–Coded Modulation", IEEE Communications Magazine, pp. 11–19, Jul. 1989.

Primary Examiner—Emmanuel L. Moise
Attorney, Agent, or Firm—Russell B. Miller; Brian S. Edmonston; Thomas R. Rouse

[57] ABSTRACT

A method and apparatus for constructing high rate trellis codes for PSK modulation that can be encoded and decoded using the encoder and decoder for a rate 1/2 punctured convolutional code. In particular, the design of trellis encoders and decoders for $2^k$-PSK modulation for rates $(km-1)/km$ for $k \geq 3$ and $m \geq 1$ is provided.

3 Claims, 4 Drawing Sheets

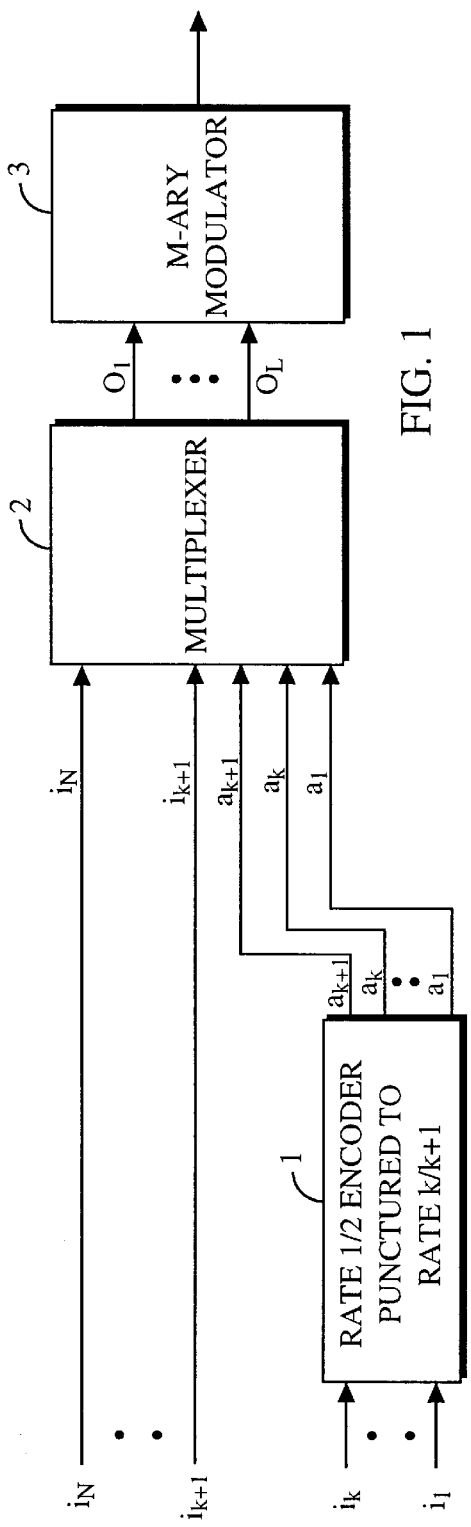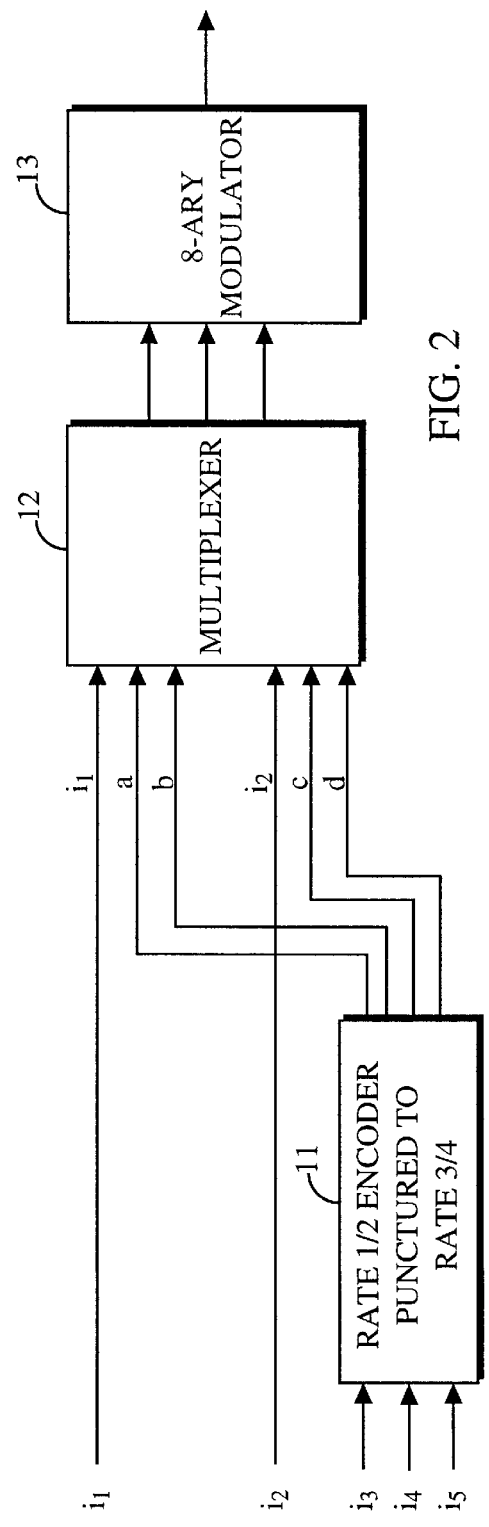

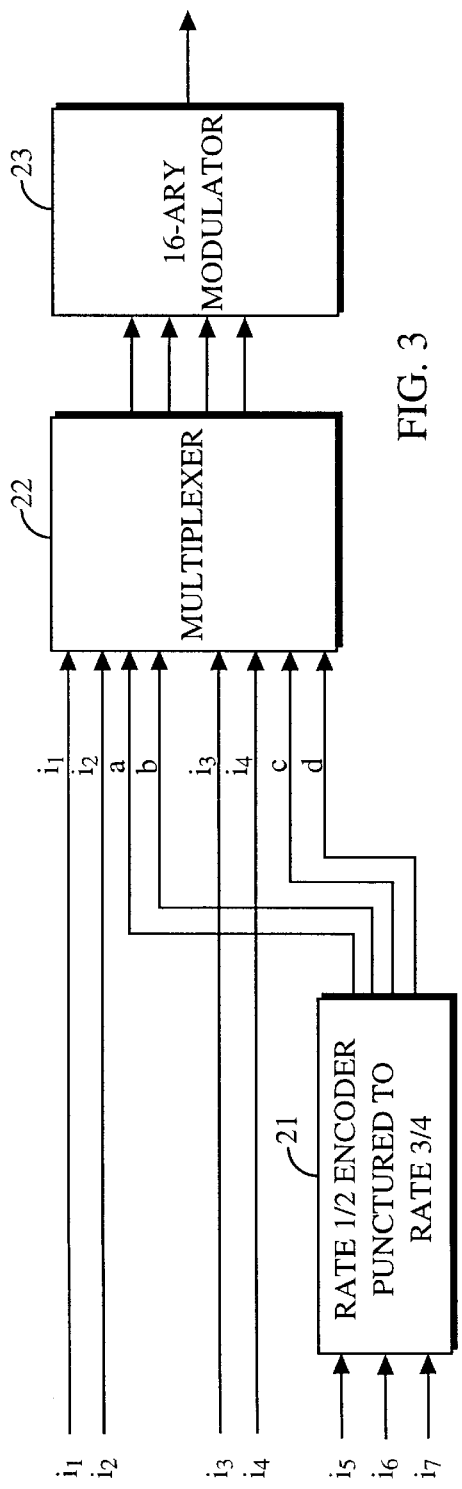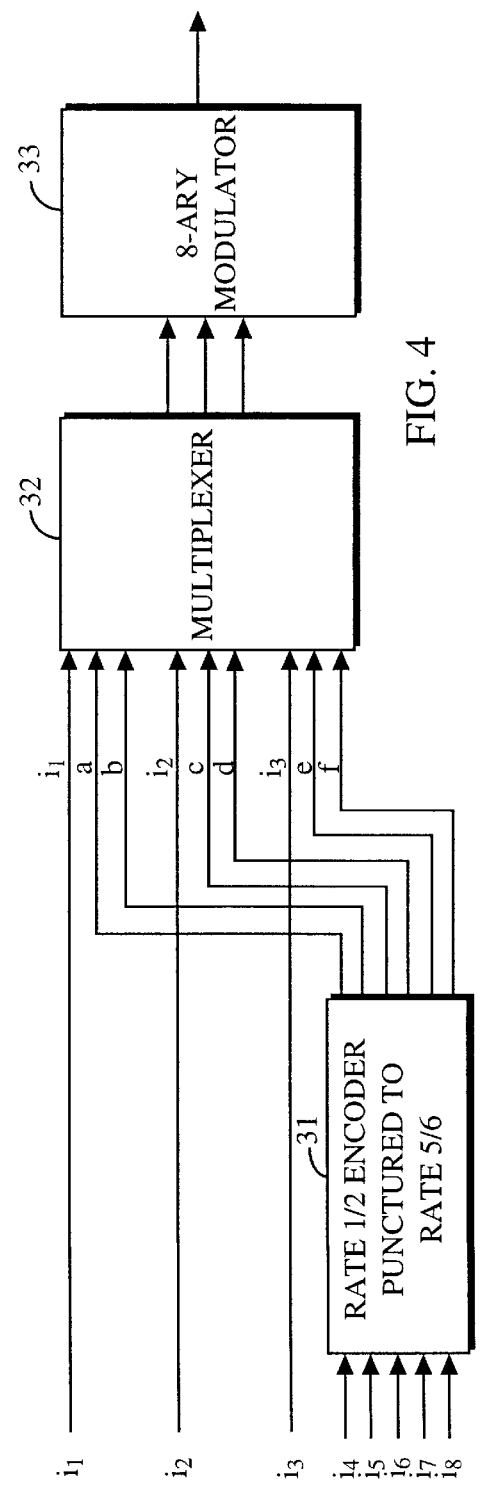

HIGH RATE TRELLIS CODING AND DECODING METHOD AND APPARATUS

This is a Continuation of U.S. patent application Ser. No. 08/779,638 filed Jan. 7, 1997 now U.S. Pat. No. 5,844,922, entitled "HIGH RATE TRELLIS CODING AND DECODING METHOD AND APPARATUS", which is a Continuation of U.S. patent application Ser. No. 08/023,789 filed Feb. 22, 1993 entitled "HIGH RATE TRELLIS CODING AND DECODING METHOD AND APPARATUS", now abandoned.

BACKGROUND OF THE INVENTION

I. Field of the Invention

The present invention relates to data communications. More particularly, the present invention relates to a novel and improved method and apparatus for encoding and decoding trellis modulated data based upon punctured convolutional codes.

II. Description of the Related Art

The field of data communications is concerned with raising the data throughput of a transmission system with a limited signal to noise ratio (SNR). The use of error correcting circuitry such as the Viterbi decoder allows system tradeoffs to be made with smaller SNRs or higher data rates to be used with the same bit error rate (BER). The decrease in the SNR needed is generally referred to as coding gain. Coding gain may be determined from bit error performance curves. In a graph of bit error performance curves, the BER of uncoded and various coded data is charted against $E_b/N_o$, where $E_b$ is the energy per bit and $N_o$ is the one sided Gaussian White Noise power spectral density. The coding gain at any point along a bit error performance curve for a particular BER level is determined by subtracting the coded $E_b/N_o$ from the uncoded $E_b/N_o$. In the paper "Viterbi Decoding for Satellite and Space Communication", by J. A. Heller and I. M. Jacobs, IEEE Transactions on Communication Technology, Vol. COM-19, pgs. 835–848, October 1971, extensive results of simulations on various decoder apparatus were reported.

The coding rate and constraint length are used to define the Viterbi decoder. The coding rate (m/n) corresponds to the number of coding symbols produced (n) for a given number of input bits (m). The coding rate of 1/2 has become one of the most popular rates, although other code rates are also generally used. One class of codes with $m \neq 1$ are called punctured codes and are produced by discarding or erasing symbols from the rate 1/n code. The constraint length (K) is related to the length of the convolutional encoder used in the encoding of the data. A constraint length of K=7 is typical in convolutional coding schemes. The convolutional encoder can be thought of as an Finite Impulse Response (FIR) filter with binary coefficients and length K-1. This filter produces a symbol stream with $2^{K-1}$ possible states.

The basic principle of the Viterbi algorithm is to take a convolutionally encoded data stream that has been transmitted over a noisy channel and use the properties of the convolutional code to determine the transmitted bit stream. The Viterbi algorithm is a computationally efficient method of updating the conditional probabilities of all $2^{K-1}$ states and finding the most probable bit sequence transmitted. In order to compute this probability, all the conditional probabilities of $2^{K-1}$ states for each bit must be computed. For a rate 1/2 code, the resulting decision from each of these computations is stored as a single bit in a path memory.

A chainback operation, an inverse of the encoding operation, is performed in which the $p \cdot 2^{K-1}$ decision bits are used to select an output bit, where p is the path memory depth. After many states the most probable path will be selected with a high degree of certainty. The path memory depth must be sufficiently long to allow this probability to approach 1. For a rate 1/2 code, an exemplary path memory depth is about (5 ·K), or 35 states. For a rate 7/8 punctured code the optimal depth increases to 96 states.

Constraint lengths of K less than 5 are too small to provide any substantial coding gain, while systems with K greater than 7 are typically too complex to implement as a parallel architecture on a single VLSI device. As the constraint length increases, the number of interconnections in a fully parallel computation section increases as a function of $(2^{K-1} \cdot L)$, where L is the number of bits of precision in the state metric computations. Therefore, where K is greater than 7, serial computation devices are generally used which employ large external random access memories (RAMs).

In the paper "Channel Coding with Multilevel/Phase Signal" by G. Ungerboeck, IEEE Transactions on Information Theory, Vol. IT-28, pgs. 55–67, January 1982, a trellis coded modulation (TCM) technique was described. In Ungerboeck it was shown that within a given spectral bandwidth, it is possible to achieve an Asymptotic Coding Gain of up to 6 dB by employing a rate (n−1)/n convolutional code and doubling the signal set. Unfortunately, for each modulation technique and for each bit rate, the maximal coding gain is achieved by a different convolutional code. Further disclosed were the results of a search for all convolutional codes for several rates and modulation techniques, and the best codes presented.

In the paper "A Pragmatic Approach to Trellis-Coded Modulation" by A.J. Viterbi, J.K. Wolf, E. Zehavi and R. Padovani, IEEE Communications Magazine, pgs. 11–19, July 1989, a pragmatic approach to trellis coded modulation (PTCM) technique was disclosed. The underlying concept therein is that a somewhat lower coding gain is achievable by a PTCM based on the "industry standard" rate 1/2, K=7 convolutional code. Although a lower coding gain is realized, it is very close to the coding gain of Ungerboeck at BERs of interest.

Trellis coding is an attractive coding technique since it possesses an aspect which other coding techniques lack. The power of trellis coding lies in the fact that even though no apparent coding operation is performed on some of the bit(s) of the input data, the decoder is able to provide error correction on all bits. Generally, the use of TCM techniques to achieve efficient use of power-bandwidth resources has been limited to low speed applications in digital signal processor implementations. The use of PTCM techniques enable VLSI implementations of an encoder/decoder capable of operating at high rates. A decoder using PTCM techniques is capable of handling different modulation techniques, such as M-ary phase-shift keying (M-ary PSK) including Binary PSK (BPSK), Quadrature PSK (QPSK), 8-PSK, and 16-PSK.

In the paper, "Development of Variable-Rate Viterbi Decoder and Its Performance Characteristics," *Sixth International Conference on Digital Satellite Communications*, Phoenix Ariz., September, 1983 Y. Yasuda, Y. Hirata, K. Nakamura and S. Otani discuss a method whereby a class of high rate binary convolutional codes can be constructed from a single lower rate binary convolutional code. The advantage of punctured codes for binary transmission is that the encoders and decoders for the entire class of codes can be constructed easily by modifying the single encoder and decoder for the rate 1/2 binary convolutional code from which the high rate punctured code was derived. The current invention will be concerned primarily with rate (m−1)/m binary convolutional codes (m a positive integer greater than or equal to 3) formed from puncturing a particular rate 1/2 convolutional code which has become a de-facto standard of the communications industry. This code has constraint length 7 and generator polynomials of $G_1(D)=1+D^2+D^3+D^5+D^6$ and $G_2(D)=1+D+D^2+D^3+D^6$. Indeed, many commercial VLSI convolutional encoder and decoder chips (including a device marketed under Part No. Q1875 by QUALCOMM Incorporated of San Diego, Calif.) contain encoders and decoders for punctured binary codes using this de-facto standard rate 1/2 code.

It is therefore an object of the present invention to provide a novel method and circuitry for encoding and decoding trellis data using punctured rate 1/2 convolutional encoders.

SUMMARY OF THE INVENTION

The present invention is a novel and improved method and apparatus for encoding and decoding trellis modulated data based upon punctured rate 1/2 convolutional codes. In accordance with the present invention a trellis encoder and decoder are disclosed in which a circuit is provided that encodes and decodes based upon punctured rate 1/2 convolutional encoding.

In a rate 5/6 punctured trellis encoder for 8-PSK modulation, each input data bit set is comprised of five bits. In a 16-PSK modulation scheme, using rate 7/8 encoding, each input data bit set is comprised of seven bits. In a general M-PSK modulation scheme, using rate $(\log_2 M-1)/\log_2 M$, each input data bit set is comprised of $\log_2 M-1$ bits. The encoder receives a set of input data bits of a sequence of input data bit sets, encodes a subset of the input data bits according to a punctured convolutional code and groups the output symbols. The groups of typically three or four bits are then passed to an 8-ary or 16-ary modulator.

The decoder uses a Viterbi decoder to generate error corrected estimates of the original data. The Viterbi decoder uses branch metrics in the decoding process developed from information contained in the phase of the received signal. The Viterbi decoder provides output symbols corresponding to estimates of the transmitted encoded symbols. The Viterbi decoder output symbols are also convolutionally re-encoded to produce corresponding re-encoded symbols for use in the recovery of the uncoded symbols. The re-encoded symbols from the convolutional encoder are supplied to error correction logic along with an uncorrected estimate of the transmitted data, which is based solely on the received phase of the modulated data. The error correction logic uses the re-encoded bits to correct the uncoded bit as contained in the uncorrected estimate of the transmitted data. The corrected estimate of the uncoded bit along with the estimate of the uncoded bits are output from the decoder as estimates of the originally encoded data.

In an alternative and improved implementation, additional circuitry is provided that provides for resolving phase ambiguities that are unresolvable in traditional implementations of the Viterbi decoder. In this alternative and improved implementation, each of the uncoded input data bits is differentially encoded with a bit that has been convolutionally encoded with the punctured convolutional encoder.

In another improved implementation, the decoder requires additional circuitry to resolve the phase ambiguities. The additional circuitry includes differential decoders and data buffers. The differential decoders differentially decode unprotected data bits with respect to protected bits.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIG. 1 is a block diagram of an exemplary generic implementation of a trellis encoder based upon a punctured convolutional encoding scheme;

FIG. 2 is a block diagram of an exemplary rate 5/6 punctured trellis encoder for 8-PSK modulation;

FIG. 3 is a block diagram of an exemplary rate 7/8 punctured trellis encoder for 8-PSK modulation;

FIG. 4 is a block diagram of an exemplary rate 8/9 punctured trellis encoder for 8-PSK modulation;

DETAILED DESCRIPTION OF THE PREFERRED EMBODIMENT

Figure 5:
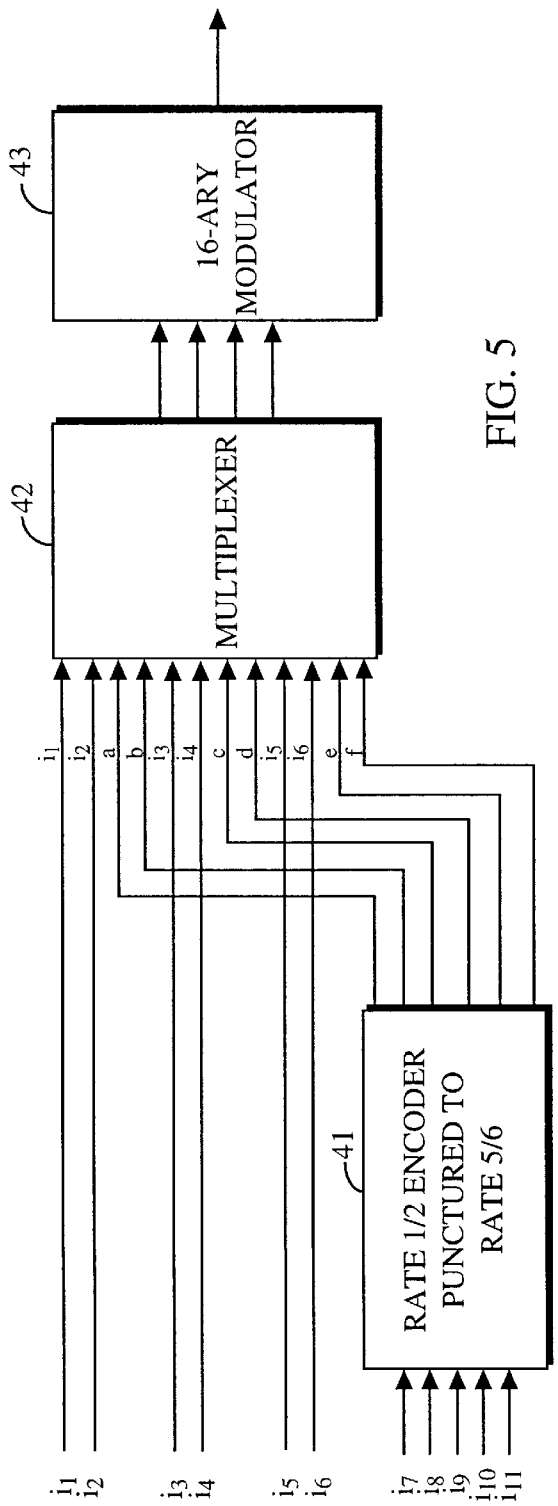
FIG. 5 is a block diagram of an exemplary rate 11/12 punctured trellis encoder for 8-PSK modulation.

For binary transmission, puncturing is a method whereby a class of high rate binary convolutional codes can be constructed from a single lower rate binary convolutional code. The advantage of punctured codes for binary transmission is that the encoders and decoders for the entire class of codes can be constructed easily by modifying the single encoder and decoder for the rate 1/2 binary convolutional code from which the high rate punctured code was derived. In the invention, the exemplary embodiment uses rate (m−1)/m binary convolutional codes (m a positive integer greater than or equal to 3) formed from puncturing a particular rate 1/2 convolutional code which has become a de-facto standard of the communications industry. In an exemplary embodiment, the code has constraint length 7 and generator polynomials $G_1(D)=1+D^2+D^3+D^5+D^6$ and $G_2(D)=1+D+D^2+D^3+D^6$. Indeed VLSI convolutional encoder and decoder chips (including the previously mentioned Q1875 chip from QUALCOMM Incorporated) contain encoders and decoders for punctured binary codes using this de-facto standard rate 1/2 code.

The high rate punctured codes have smaller free Hamming distances than the original unpunctured codes. For example, the above mentioned constraint length 7 code has a free Hamming distance equal to 10. When punctured to form higher rate codes, the minimum free Hamming distance decreases as indicated in Table I as follows:

TABLE I

Minimum Free Hamming Distance of the Punctured Codes Formed From the De-Facto Standard Rate 1/2 Convolutional Code of Constraint Length 7

| Code Rate | Minimum Free Hamming Distance | Number of Minimum Distance inCode Words |
|---|---|---|
| 1/2 | 10 | 36 |
| 2/3 | 6 | 3 |
| 3/4 | 5 | 42 |

TABLE I-continued

Minimum Free Hamming Distance of the Punctured Codes Formed From the De-Facto Standard Rate ½ Convolutional Code of Constraint Length 7

| Code Rate | Minimum Free Hamming Distance | Number of Minimum Distance inCode Words |
|---|---|---|
| 4/5 | 4 | 12 |
| 5/6 | 4 | 92 |
| 6/7 | 3 | 5 |
| 7/8 | 3 | 9 |

In an alternative implementation, a rate 1/2 convolutional encoder and decoder without puncturing can be used as the engine to construct high rate trellis encoders and decoders for PSK trellis coded modulation. The current invention shows how to construct encoders and decoders for high rate PSK trellis codes using a punctured encoder and decoder for the rate 1/2 convolutional code as the basic building block. The performance of these codes is superior to the codes in the alternative implementation for a wide range of code rates. A comparison of the codes formed from these two techniques for trellis coded 8-PSK and 16 PSK modulation is shown below in Table II.

TABLE II

| Modulation | Code Rate | Min. Squared Free Euclidean Distance | |
|---|---|---|---|
| | | (Not Punctured) | (Punctured) |
| QPSK | 1 (uncoded) | 2.000 | n.a. |
| 8-PSK | 2/3 (Q1875) | 4.000 | n.a. |
| | 5/6 | 2.000 | 2.929 |
| | 8/9 | 1.750 | 2.34 |
| | 1 (uncoded) | 0.586 | n.a. |
| 16-PSK | 3/4 (Q1875) | 2.000 | n.a. |
| | 7/8 | 0.586 | 0.7612 |
| | 11/12 | 0.457 | 0.6088 |
| | 1 (uncoded) | 0.152 | n.a. |

A comparison of the performance of the codes disclosed herein with respect to uncoded systems is given below in Table Ill.

TABLE III
1. Rate 5/6 8-PSK vs. uncoded QPSK
   25% increase in transmission rate at same bandwidth.
   1.7 db improvement in minimum squared Euclidean distance.
2. Rate 8/9 8-PSK vs. uncoded QPSK
   33% increase in transmission rate at same bandwidth.
   0.7db improvement in minimum squared Euclidean distance.
3. Rate 5/6 8-PSK vs. uncoded 8-PSK
   17% decrease in transmission rate at same bandwidth.
   7.0 db improvement in minimum squared Euclidean distance.
4. Rate 8/9 8-PSK vs. uncoded 8-PSK
   11% decrease in transmission rate at same bandwidth.
   6.0 db improvement in minimum squared Euclidean distance.
5. Rate 7/8 16-PSK vs. uncoded 8-PSK
   17% increase in transmission rate at same bandwidth.
   1.1 db improvement in minimum squared Euclidean distance.

TABLE III (Cont.)
6. Rate 11/12 16-PSK vs. uncoded 8-PSK
   22% increase in transmission rate at same bandwidth.
   0.2 db improvement in minimum squared Euclidean distance.
7. Rate 7/8 16-PSK vs. uncoded 16-PSK
   12.5% decrease in transmission rate at same bandwidth.
   7.0 db improvement in minimum squared Euclidean distance.
8. Rate 11/12 16-PSK vs. uncoded 16-PSK
   8% decrease in transmission rate at same bandwidth.
   6.0 db improvement in minimum squared Euclidean distance.

Another measure of quality for trellis codes whose encoders and decoders use as their engine a single chip containing a binary convolutional encoder and matched Viterbi decoders is the maximum bit rate (in bits per second) that can be supported by the single chip. A comparison of the maximum bit rate that can be achieved using a single chip that can decode a rate 1/2 binary convolutional code at 20 megabits per second (which is the case for the Q1875 chip) is given below in Table IV. From the table it is seen that the codes discussed in the current invention have better free squared Euclidean distance than the codes of the alternative implementation but have a lower maximum transmission rate than those codes for a single chip implementation. Table IV considers the case for a maximum transmission rate for trellis coded 8-PSK and 16-PSK modulation assuming a 20 Megabit per second chip for a rate 1/2 convolutional code.

TABLE IV

| Modulation | Code Rate | Transmission Rate bps/Hz | Transmission Rate Megabits per Second MHz | |
|---|---|---|---|---|
| | | | (Non-Punctured) | (Punctured) |
| 8-PSK | 5/6 | 2.50 | 100 | 33.3 |
| | 8/9 | 2.67 | 160 | 32.0 |
| | 11/12 | 2.75 | 220 | 31.4 |
| 16-PSK | 7/8 | 3.50 | 140 | 46.6 |
| | 11/12 | 3.67 | 220 | 44.0 |

A series of exemplary implementations are presented for 8-PSK and 16-PSK trellis coded modulation based upon punctured rate 1/2 binary convolutional codes. Throughout the examples, it will be assumed that the phase of the PSK carrier is known exactly at the receiver and that the only perturbation is additive white Gaussian noise. An improvement for mitigating against a phase ambiguity will be described at the end of the detailed embodiment description.

In FIG. 1, a set of N input data bits are received at the encoder 1, k of which (bits $i_1, i_2, \ldots, i_k$) are convolutionally encoded using a rate k/k+1 encoder based upon a punctured rate 1/2 convolutional encoder 1. The encoded symbols ($a_1, a_2, \ldots, a_k, a_{k+1}$) along with the remaining input bits ($i_{k+1}, i_{k+2}, \ldots, i_N$) are provided to a multiplexer 2. Multiplexer 2 combines the encoded symbols with the remaining input data bits so as to provide sets of data to the M-ary modulator 3. Each set is comprised of $\log_2 M$ elements and are typically provided sequentially to M-ary modulator 3 for transmission.

In the exemplary implementations illustrated in the remaining figures, a specific mapping between binary digits and phases of the PSK signal will be assumed. For 8-PSK this mapping will be 0°=000, 45°=001, 90°=011, 135°=010, 180°=100, 225°=101, 270°=111, and 315°=110. For 16-PSK the mapping will be 0°=000, 22.5°=0001, 45°=0011, 67.5°=0010, 90°=0100, 112.5°=0101, 135°=0111, 157.5°=0110, 180°=100, 202.5°=1101, 225°=1111, 247.5°=1110, 270°=1000, 292.5°=1001, 315°=1011, and 337.5°=1010. Mapping arrangements may readily be made for higher order M-ary modulation schemes using this scheme. Although a modified Gray coding scheme is exemplified in this mapping, it is not critical to the invention such that other mapping schemes may be devised.

Referring to FIG. 2, five input lines labeled (i1, i2, i3, i4, i5) are provided to the encoding circuit. These lines are arranged with two single lines i1 and i2, and a bundle of three lines (i3, i4, and i5). The three lines (i3, i4, and i5) are used as inputs to a punctured rate 1/2 convolutional encoder 11. For example, the puncturing is such that after the input i3, both outputs are taken from the convolutional encoder 11 (denoted a and b), after the input i4 only one of the outputs (corresponding to the polynomial $G_1(D)=1+D^2+D^3+D^5+D^6$) is taken (denoted c) and after the input i5 the other output (corresponding to the polynomial $G_2(D)=1+D+D^2+D^3+D^6$) is taken (denoted d). The two lines i1 and i2 are said to carry "uncoded" binary digits while the three lines i3, i4 and i5 are said to carry "coded" binary digits. The four binary digits a, b, c and d are grouped with the uncoded binary digits in the manner shown to produce at the output 6 binary digits on 6 lines. These lines are divided into two bundles of three lines each ((i1,a,b) and (i2,c,d)). The three bits in each bundle should be considered a 3-bit octal number where the bits labeled i1 and i2 are the most significant bits in each of the 3-bit numbers.

Each of the two sets are provided to multiplexer 12 which provides the three bit octal numbers sequentially to the 8-ary modulator 13. Each octal number will be mapped into one 8-PSK signal so that the trellis coded modulator 13 produces two 8-PSK signals for each 5 bit input. The code is said to be a rate 5/6 trellis code for 8-PSK modulation. Assuming that uncoded 8-PSK can transmit information at 3 bits/Hz, this code will transmit information at 2.5 bits/Hz.

For each transmitted phase, the receiver processes the received waveform and outputs a pair of real numbers (or one complex number) denoted by "I" and "Q". Two of these complex numbers (corresponding to the receiver outputs for the two transmitted phases) are then used as inputs to the decoder for the trellis code. It is assumed that this decoder uses as an engine, a Viterbi decoder matched to the punctured rate 1/2 convolutional code. The branches of the trellis upon which the Viterbi decoder operates are labeled by the pairs (a,b), (c,X) and (X,d) where X denotes the erasure symbol. Thus, prior to Viterbi decoding, the proper branch metrics for each of the values (a,b), (c,X) or (X,d) must be computed. The first pair of complex numbers are used to obtain the four branch metrics for (a,b), the next pair of complex numbers are used to obtain the two branch metrics for (c,X) and the two branch metrics for (X,d) and then the process repeats. The calculation of the branch metrics for (a,b) is done in the usual way. That is, for each of the four values that (a,b) can take on, one computes the squared Euclidean distance to the closest of the two signal points that corresponds to that value of (a,b). To calculate the metric for the value (c,X), for c=0 and for c=1, one calculates the squared Euclidean distance to the closest of the four signal points consistent with that value of c. Using the same complex number, one does the same for the metrics for (X,d). The above discussion assumes that, as is the case for the Q1875 chip, externally generated branch metrics can be utilized by the decoder. If this is not the case, one can instead predistort the complex numbers so as to artificially obtain the desired branch metrics.

Since, at this point in the decoding algorithm, it is not known which branches will be chosen by the Viterbi decoder, the information required to pick the best values for the uncoded digits must be stored. There are several ways to store this information. The most obvious way is to store the two (I,Q) pairs. A more efficient method of storage is to determine for each of the (I,Q) pairs the value of j for which $(j-1)(360°/8)<\tan^{-1}(Q/I)<j(360°/8)$. This requires 3 bits for each (I,Q) pair. The value of "j" is referred to as the "sector information." Given the two values of "j" and the value of (a,b) or (c,d), the best choice for the 2 uncoded binary digits can be determined.

The Viterbi decoder then operates in its normal way to select the best path through the trellis of the rate 1/2 code. The output of this decoder is an estimate of the bits on lines i3, i4, and i5. This bit stream is then re-encoded to produce the best estimate of the sequence of (a,b), (c,X) and (X,d) values that correspond to the best path through the trellis. As stated previously, this information along with the sector information is sufficient to give the uncoded bit streams.

Assuming that the PSK signals are placed on the unit circle, the minimum squared Euclidean distance between parallel transitions is 4.0. Since the rate 3/4 punctured code used has a free Hamming distance of 5, the trellis code has a free squared Euclidean distance of at least $5 \cdot (2 \cdot \sin(22.5°))^2 = 2.929$. This is the case because of the particular mapping chosen to map 3 binary digits into phases of the 8-PSK signal. In particular, if the two least significant digits differ in one position, then the corresponding squared Euclidean distance between the phases is at least $(2 \cdot \sin(22.5°))^2$ while if these two least significant digits differ in two positions, the squared Euclidean distance between the phases is at least $(2 \cdot \sin(45°))^2 > 2(2 \cdot \sin(22.5°))^2$. Thus, a free Hamming distance of 5 for the rate 3/4 convolutional code translates into a free squared Euclidean distance of $5 \cdot (2 \cdot \sin(22.5°))^2 = 2.929$. If a rate 3/4 punctured code had been used whose free Hamming distance was at least 7, then the parallel transitions would have dominated since $7 \cdot \sin(22.5°)^2 > 4$.

The operation of the rate 7/8 punctured trellis code for 16-PSK modulation is analogous to the 5/6 punctured code with groupings as shown in FIG. 3. The operation of this encoder is similar to that for the encoder of FIG. 2 with now seven input bits. Encoder 21 produces from three input bits four symbols as was discussed with reference to FIG. 2. Two uncoded input bits are paired with two coded bits from encoder 21 to form two four-symbol groups which are provided to multiplexer 22. Multiplexer 22 provides in sequence the four-symbol groups to the 16-ary modulator 23. Each hex number will be mapped into a 16-PSK signal so that the modulator 23 produces two 16-PSK signals for each 7 bit input.

Assuming that the PSK signals are placed on the unit circle, the minimum squared Euclidean distance between parallel transitions is 2.00. By an argument similar to that given for the previous example, for the assumed mapping of 4tuples into 16-PSK phases, the trellis code has a free squared Euclidean distance of at least $5 \cdot (2 \cdot \sin(11.25°))^2 = 0.761$. If a rate 3/4 punctured code had been used whose free Hamming distance was at least 14, then the parallel transitions would have dominated since $14 \cdot (2 \cdot \sin(11.25°))^2 > 2$.

The encoding circuit of FIG. 4 maps 8 input bits into three 8-PSK signals. There are three single lines i1, i2 and i3 and a bundle of five lines (i4, i5, i6, i7, and i8) to the encoding circuit. The bundle of five lines (i4, i5, i6, i7, and i8) is provided to a punctured rate 1/2 convolutional encoder 31. The puncturing is such that after the input i4, both outputs are taken from the convolutional encoder (denoted a and b), after the input i5 only the first output is taken (denoted c), after the input i6 the second output is taken (denoted d), after the input i7, again only the first output is taken (denoted e), and after the input i8 only the second output is taken (denoted f). The three lines i1, i2 and i3 are said to carry "uncoded" binary digits while the five lines i4, i5, i6, i7, and i8, are said to carry "coded" binary digits.

The six binary digits a, b, c, d, e, and f are grouped with the uncoded binary digits in the manner shown to produce at the output 9 binary digits on 9 lines. These lines are divided into three bundles of three lines each ((i1,a,b), (i2,c,d), and (i3,e,f)). These bundles are provided to multiplexer 32 which sequentially provides the data on these lines to the 8-ary modulator 33. The three bits in each bundle should be considered a 3-bit octal number where the bits labeled i1, i2 and i3 are the most significant bits in each of the 3-bit numbers. Each octal number will be mapped into one 8-PSK signal so that the trellis coded modulator produces three 8-PSK signals for each 8 bit input. The code is said to be a rate 8/9 trellis code for 8-PSK modulation. Assuming that uncoded 8-PSK can transmit information at 3 bits/Hz, this code will transmit information at 2.67 bits/Hz.

For each transmitted phase, the receiver processes the received waveform and outputs a pair of real numbers (or one complex number) denoted by "I" and "Q". Three of these complex numbers (corresponding to the receiver outputs for the three transmitted phases) are then used as inputs to the decoder for the trellis code. It is assumed that this decoder uses as an engine, a Viterbi decoder matched to the punctured rate 1/2 convolutional code. The branches of the trellis upon which the Viterbi decoder operates are labeled by the pairs (a,b), (c,X), (X,d), (e,X) and (X,f) where X denotes the erasure symbol. Thus, prior to Viterbi decoding, the proper branch metrics for each of the values (a,b), (c,X), (X,d), (e,X) or (X,f) must be computed. That is, the first pair of complex numbers are used to obtain the four branch metrics for (a,b), the next pair of complex numbers are used to obtain the two branch metrics for (c,X), and for (X,d), the next pair of complex numbers are used to obtain the two branch metrics for (e,X) and for (X,f), and then the process repeats. Again, it is assumed that as is the case for the Q1875 chip, externally generated branch metrics can be utilized by the decoder or that one can predistort these inputs to give the desired branch metrics.

Since, at this point in the decoding algorithm, it is not known which branches will be chosen by the Viterbi decoder, the information required to pick the best values for the uncoded digits must be stored. There are several ways to store this information. The most obvious way is to store the two (I,Q) pairs. A more efficient method of storage is to determine for each of the (I,Q) pairs the value of j for which $(j-1)(360°/16) < \tan^{-1}(Q/I) < j(360°/16)$. This requires 4 bits for each (I,Q) pair. The value of "j" is referred to as the "sector information." It is easy to verify that given the three values of "j" and the value of (a,b), (c,d), and (e,f), the best choice for the uncoded binary digits can be selected.

The Viterbi decoder then operates in its normal way to choose the best path through the trellis of the rate 1/2 code. The output of this decoder is an estimate of the bits on lines i4, i5, i6, i7, and i8. This bit stream is then re-encoded to produce the best estimate of the sequence (a, b, c, d, e, f) that corresponds to the best path through the trellis. As stated previously, this information along with the sector information is sufficient to give the uncoded bit streams.

Assuming that the PSK signals are placed on the unit circle, the minimum squared Euclidean distance between parallel transitions is 4.0. Since the rate 5/6 punctured code used has a free Hamming distance of 4, the trellis code has a free squared Euclidean distance of at least $4 \cdot (2 \cdot \sin(22.5°))^2 = 2.343$. If a rate 3/4 punctured code had been used whose free Hamming distance was at least 7, then the parallel transitions would have dominated.

Referring to FIG. 5, the operation of the rate 11/12 punctured trellis code is analogous to the 8/9 punctured code with groupings as shown in FIG. 4. The operation of this encoder is similar to that for the encoder of FIG. 4 now with eleven input bits. Encoder 41 produces from five input bits six symbols as was discussed with reference to FIG. 4. Two uncoded input bits are paired with two coded bits from encoder 21 to form three four-symbol groups which are provided to multiplexer 42. Multiplexer 42 provides, in sequence the four-symbol groups to 16-ary modulator 43. Each hex number will be mapped into a 16-PSK signal so that modulator 23 produces three 16-PSK signals for each 11 bit input.

Assuming that the PSK signals are placed on the unit circle, the minimum squared Euclidean distance between parallel transitions is 2.00. Since the rate 5/6 punctured code used has a free Hamming distance of 4, the trellis code has a free squared Euclidean distance of at least $4 \cdot (2 \cdot \sin(11.25°))^2 = 0.609$. If a rate 5/6 punctured code had been used whose free Hamming distance was at least 14, then the parallel transitions would have dominated.

The examples described in the previous section for 8-PSK and 16-PSK utilize a punctured binary rate 1/2 convolutional encoder and matched Viterbi decoder as its basic building block. The basic approach, however can be utilized with any punctured code convolutional code and any modulation scheme. How to construct trellis codes for $2^k$-ary PSK modulation (k>2) based upon any punctured convolutional code is described as follows. Since high rate codes are of principal interest the discussion will only concern the construction of trellis codes of rate (km−1)/km where m is an integer greater than 1.

A trellis code of rate (km−1)/km over $2^k$-ary PSK modulation encodes (km−1) binary digits into m symbols from $2^k$-ary PSK modulation. If one uncoded binary digit for each $2^k$-ary symbol were used, it would result in a total of m uncoded inputs and ((km−1)-m)=((k−1)m−1) coded inputs. This would imply the use of a convolutional code punctured to rate ((k−1)m−1)/(k−1)m. The (k−1)m outputs of the binary convolutional encoder would be broken up into m groups each group containing (k−1) binary digits. The (k−1) binary digits from as each group would be combined with one uncoded digit (with the uncoded digit being the most significant bit of the k digits) to form a bundle of k binary digits. The result would be m bundles which are then mapped to m $2^k$-ary symbols. Since the uncoded digit represents parallel transitions in the decoder trellis for the trellis code, the minimum squared Euclidean distance between parallel transitions would be equal to 4 (assuming the PSK signals are equally spaced on the unit circle and that signals which differ only in the most significant bit are on a diameter of the circle). If the punctured convolutional code of rate ((k−1)m−1)/(k−1)m has free Hamming distance $d_1$, then the free squared Euclidean distance of the trellis code is equal to the minimum of 4 and $d_1(2 \cdot \sin(360°/2^{k+1}))^2$.

Suppose, however, two uncoded binary digits are used for each of the m $2^k$-ary symbols. Then, there would be a total of 2m uncoded inputs and ((km−1)−2m)=((k−2)m−1) coded inputs. This would imply the use of a convolutional code punctured to rate ((k−2)m−1)/(k−2)m. The (k−2)m outputs of the binary convolutional encoder would be broken up into m groups each group containing (k−2) binary digits. The (k−2) binary digits from each group would be combined with two uncoded digits (with the uncoded digits being the two most significant bits of the k digits) to form a bundle of k binary digits. The result would be m bundles which are then mapped to m $2^k$-ary symbols. Since the uncoded digits represent parallel transitions in the decoder trellis for the trellis code, the minimum squared Euclidean distance between parallel transitions would be equal to 2 (assuming the PSK signals are equally spaced on the unit circle and that signals which differ only in the two most significant bits are separated by either 90° or 180°). If the punctured convolutional code of rate $((k-2)m1)/(k-2)m$ has free Hamming distance $d_2$, then the free squared Euclidean distance of the trellis code is equal to the minimum of 2 and $d_2(2\cdot\sin(360°/2^{k+1}))^2$.

One could conceive of having three or more uncoded bits for each of the m $2^k$-ary symbols. One might think that one should choose the number of uncoded bits per $2^k$-ary symbol solely on the basis of obtaining a trellis code with the maximum free squared Euclidean distance. However, the choice of the number of uncoded bits per $2^k$-ary symbol also effects the maximum speed of transmission for a single chip implementation. For example, assume that p uncoded bits were used for each of the m $2^k$-ary symbols so that a rate $((k-p)m-1)/(k-p)m$ punctured convolutional code is required. Assume that this code is formed by puncturing a rate 1/2 convolutional code where the puncturing is such that one takes a pair of outputs from the encoder and then punctures one of the two outputs for the next (k-p)m-2 inputs. If the chip which implements this punctured code can operate at a maximum information rate of 20 megabits per second, a single chip implementation of the trellis code will operate at a maximum information rate of 20·(km-1)/((k-p)m-1) megabits per second. Note that this maximum rate is a monotonic decreasing function of p so that p=1 gives the largest information rate for a single chip implementation.

So far, in the detailed description of exemplary implementations, it has been assumed throughout that the receiver has perfect knowledge of the phase of the transmitted carrier. In an improved implementation, a means whereby this assumption can be relaxed is described. The discussion will focus on the code given in Example 1 (a rate 5/6 trellis code for 8-PSK modulation) although the technique can be used for any of the codes described in the descriptions.

Recalling that the mapping for 8-PSK modulation which was: 0°=000, 45°=001, 90°=011, 135°=010, 180°=100, 225°=101, 270°=111, 315°=110. Note that for phase shifts of 45°, 135°, 225°, and 315° exactly one of the two least significant bits will be complemented. The effect is as if the binary digits were transmitted over a binary symmetric channel with an error rate of 50%. The Viterbi decoder which attempts to decode these digits will see a very rapid growth of all of its path metrics. Since these path metrics have to be normalized whenever they get too large, the effect will be a large increase in the frequency of this normalization which can be detected. Whenever this occurs, the phase reference can be either increased or decreased by 45°.

However, in the cases of phase ambiguities of 90°, 180°, and 270°, note that for the assumed mapping, this set of phase shifts results in either both of the two least significant bits being complemented or neither of the two least significant bits being complemented. Since the rate 1/2, constraint length 7, (de-facto standard) convolutional code has the property that the complement of a code word is a code word, in the absence of other errors, the result will be that the Viterbi decoder for the convolutional code will produce the complement of the correct information sequence. Thus, if the original input to the convolutional encoder had been differentially encoded using a 1/(1+D) (mod 2) encoder, then after differentially decoding at the receiver, the correct information sequence for the coded bits would be obtained. The problem of the uncoded bits (i.e., the most significant bits in the phase mapping) remains.

Figure 6:
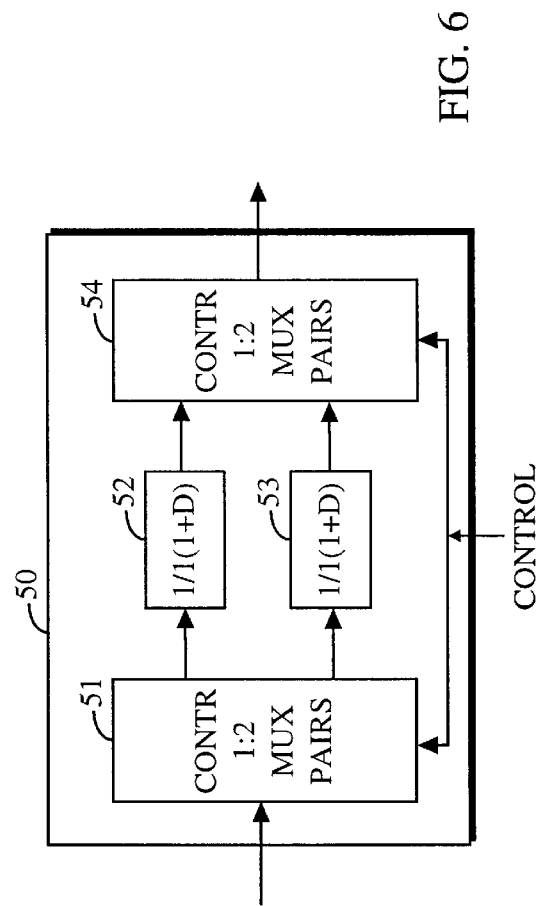
FIG. 6 is a block diagram of an exemplary controlled differential encoder.

Note that for the set of phase shifts 90°, 180°, and 270°, if the binary vectors were divided into two sets depending upon whether their middle bit is a 0 or a 1, then in each set, the most significant bit is either complemented or not complemented. This suggests utilizing a controlled differential encoder for the uncoded bits where the control bit is the middle bit in the mapping. Such a controlled differential encoder is shown in FIG. 6. Further details on this encoder and its application in trellis coded modulation is disclosed in copending U.S. patent application Ser. No. 07/695,397 entitled "METHOD AND APPARATUS FOR RESOLVING PHASE AMBIGUITIES IN TRELLIS-CODED MODULATED DATA", filed May 3, 1991, now U.S. Pat. No. 5,233,630, and assigned to the assignee of the present invention.

Referring to FIG. 6, the input and output of encoder 50 is a binary stream. If the control signal is a 1 (0), the input is directed by multiplexer 51 to, and the output is taken by multiplexer 54 from the top (bottom) differential encoder 52 (53). A controlled differential decoder has the same form except that the 1/(1+D) circuits are replaced by (1+D) circuits.

An alternative method for obtaining tolerance to phase shifts involves using a precoder of the form $1/G_1(D)$ before the convolutional encoder. Further details of this circuit are disclosed in copending U.S. patent application Ser. No. 08/011,619, also entitled "METHOD AND APPARATUS FOR RESOLVING PHASE AMBIGUITIES IN TRELLIS-CODED MODULATED DATA", filed Feb. 1, 1993, now U.S. Pat. No. 5,428,631 and assigned to the assignee of the present invention.

Figure 7:
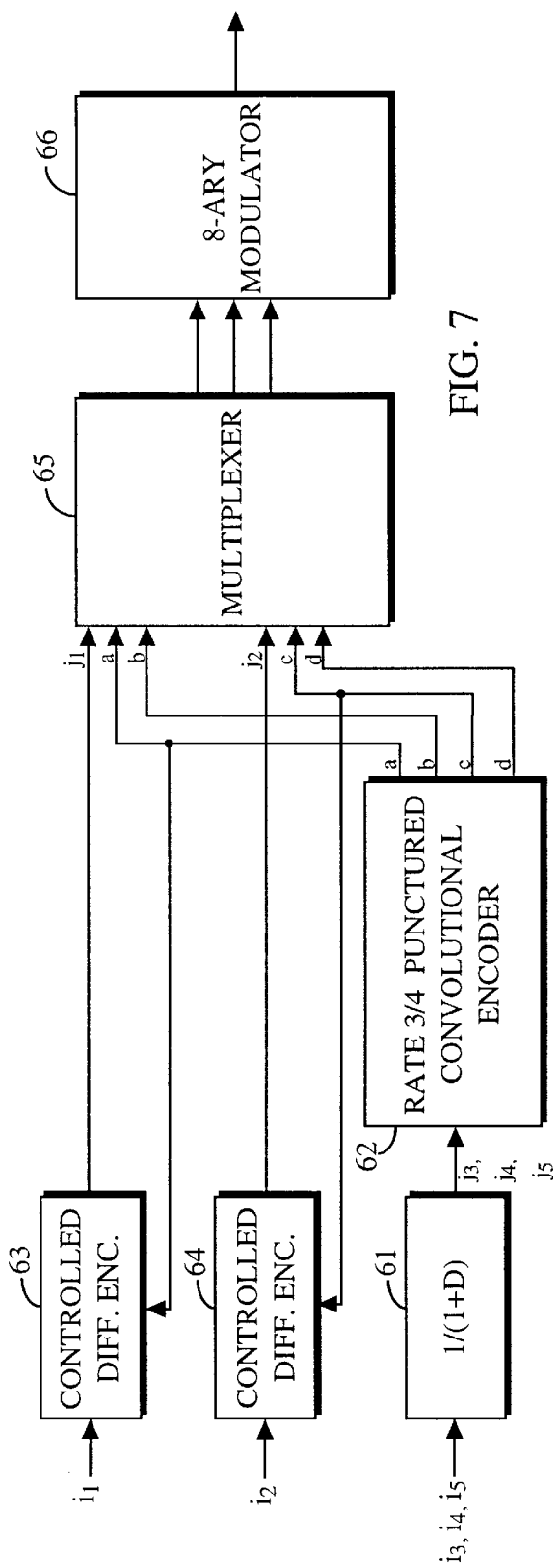
FIG. 7 is a block diagram of an exemplary rate 5/6 punctured trellis encoder for 8-PSK modulation with preceding.

FIG. 7 illustrates an exemplary rate 5/6 punctured trellis encoder for 8-PSK modulation with precoding to resolve phase ambiguities. The encoding circuit of FIG. 7 is identical to that discussed with respect to FIG. 2 with the exception of the changes due to the precoding circuitry. In FIG. 7, the bits i1 and i2 are provided to controlled differential encoders 63 and 64 while the bits i3, i4, and i5 are provided to differential encoder 61. The differentially encoded bits i3, i4, and i5 are provided from differential encoder 61 as the bits j3, j4, and j5 to a rate 1/2 convolutional encoder 62 punctured to produce rate 3/4 data. Encoder 62 produces the symbols a, b, c, and d as was discussed with reference to FIG. 2.

The symbols a and c are respectively provided to controlled differential encoders 63 and 64, as the control input. The i1 and i2 bits encoded by encoders 63 and 64 are provided as the bits j1 and j2. The bit j1 is grouped with the symbols a and b as provided to multiplexer 65, while the bit j2 is grouped with the symbols c and d as provided thereto. Multiplexer 65 provides, in sequence the symbol groups to 8-ary modulator 66 for modulation.

Figure 8:
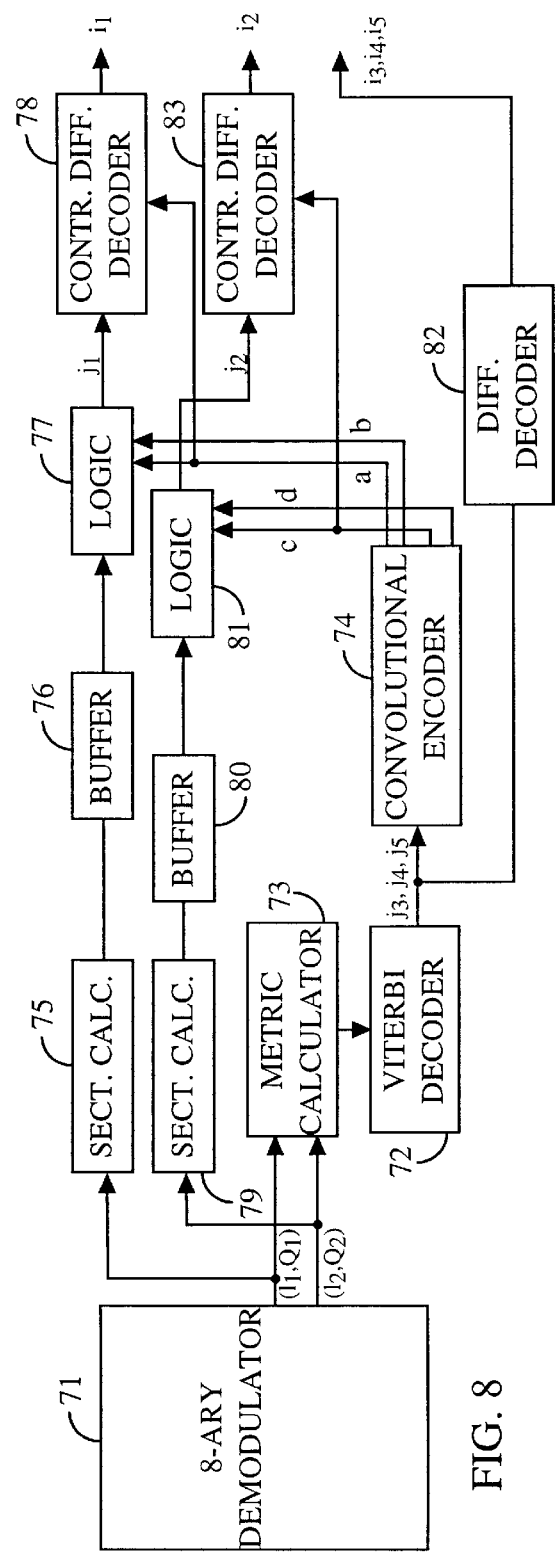
FIG. 8 is a block diagram of an exemplary rate 5/6 punctured trellis decoder for 8-PSK modulation with preceding.

FIG. 8 illustrates an exemplary decoder for trellis coded modulation of the type discussed herein. For purposes of explanation, the exemplary encoder of FIG. 8 is configured for decoding 8-PSK modulated data for a rate 5/6 punctured trellis code. However, it should be understood that other rates and modulation types may be readily derived therefrom.

The decoder in FIG. 8 is an extension of the trellis decoder incorporated within the Q1875 chip with an additional circuitry for recovering an additional uncoded bit. In FIG. 8, 8-ary PSK demodulator 71 provides two sets of phase data as I and Q samples (I1, Q1) and (I2, Q2), one for each received encoded group for the 5/6 encoded data. The (I1, Q1) and (I2, Q2) samples are both provided to metric calculator 73 for computing metrics associated with each set of I and Q phase data. The computed branch metrics are provided to Viterbi decoder 72 for generating estimates of the data bits j3, j4, and j5. The bits j3, j4, and j5 are provided through differential decoder 82 (having a function of (1+D)) to produce estimates of the bits i3, i4, and i5.

The (I1, Q1) and (I2, Q2) samples are respectively provided to sector calculators 75 and 79, where a 3-bit sector value corresponding to the received phase of the signal is generated. These sector values are hard decision estimates of the value which the transmitted phase represented. These values are respectively provided to buffers 76 and 80, and then to logic 77 and 81.

Returning to the output of Viterbi decoder 72, the bits j3, j4, and j5 are also provided to convolutional encoder 74 for re-encoding in an identical manner in which they were encoded for transmission. The outputs from encoder 74 are the symbol estimates a, b, c, and d. The symbol estimates a and b are provided to logic 77, while the symbol estimates c and d are provided to logic 81. These symbol estimates are used by logic 77 and 81 to correct for errors in the uncoded bit represented in the transmitted 3-bit value. It should be noted that in each sector value provided to logic 77 and 81 two of the bits are hard decision estimates of the a and b transmitted bits. The remaining bit in each sector value is a hard decision estimate of the uncoded bit j1 or j2. Details on this correction is disclosed in further detail in copending U.S. patent application Ser. No. 07/767,167 entitled "VITERBI DECODER BIT EFFICIENT CHAINBACK MEMORY METHOD AND DECODER INCORPORATING SAME", filed Sep. 27, 1991, now U.S. Pat. No. 5,469,452 and assigned to the assignee of the present invention. The bit estimates j1 and j2 output from logic 77 and 81 are respectively provided to controlled differential decoders 78 and 83. Decoders 78 and 83 respectively receive the symbol estimates a and c as the control input for controlling the multiplexed differential decoding of the bit estimates j1 and j2. As a result of the decoding of decoders 78 and 83, the bit estimates i1 and i2 are produced.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A method for performing trellis modulation comprising the steps of:

receiving a set of bits for transmission;

encoding one bit from said set of bits yielding a first symbol and a second symbol;

performing first phase modulation of a signal using a first symbol word comprised of said first symbol and a first subset of said set of bits, wherein said first subset does not include said one bit; and performing second phase modulation of said signal using a second symbol word comprised of said second symbol and a second subset of said set of bits, wherein said second subset does not include said one bit.

2. Apparatus for performing trellis coded modulation, comprising:

means for receiving a set of bits for transmission;

means for encoding one bit from the set of bits yielding a first symbol and a second symbol;

means for performing first phase modulation of a signal using a first symbol word comprising the first symbol and a first subset of the set of bits, wherein the first subset does not include the one bit; and means for performing second phase modulation of the signal using a second symbol word comprising the second symbol and a second subset of the set of bits, wherein the second subset does not include the one bit.

3. A circuit for performing trellis coded modulation, comprising:

means for receiving a set of bits for transmission; and an encoder-modulator module coupled to the means for receiving and configured to encode one bit from the set of bits yielding a first symbol and a second symbol, perform first phase modulation of a signal using a first symbol word comprising the first symbol and a first subset of the set of bits, wherein the first subset does not include the one bit, and perform second phase modulation of the signal using a second symbol word comprising the second symbol and a second subset of the set of bits, wherein the second subset does not include the one bit.

* * * * *